United States Patent [19]

Beppu et al.

[11] Patent Number: 5,258,575
[45] Date of Patent: Nov. 2, 1993

[54] CERAMIC GLASS INTEGRATED CIRCUIT PACKAGE WITH INTEGRAL GROUND AND POWER PLANES

[75] Inventors: Henry Beppu; Toshi Kusuhara; Aki Nomura, all of San Diego, Calif.

[73] Assignee: Kyocera America, Inc., San Diego, Calif.

[21] Appl. No.: 689,170

[22] Filed: Apr. 22, 1991

Related U.S. Application Data

[63] Continuation-in-part of Ser. No. 641,698, Jan. 16, 1991, which is a continuation-in-part of Ser. No. 519,796, May 7, 1990, Pat. No. 4,992,628.

[51] Int. Cl.$^5$ ............................................. H05K 5/06
[52] U.S. Cl. .................................. 174/52.4; 29/827; 428/620; 257/678
[58] Field of Search ................ 174/52.4; 357/70, 71, 357/74, 80; 29/827, 829, 832, 840, 841; 428/620

[56] References Cited

U.S. PATENT DOCUMENTS 4,891,687  1/1990  Mallik et al. ............................ 357/70
4,931,854  6/1990  Yonemasu et al. .................... 357/74

Primary Examiner—Leo P. Picard
Assistant Examiner—Bot Ledynh
Attorney, Agent, or Firm—Spensley Horn Jubas & Lubitz

[57] ABSTRACT

A ceramic-glass integrated circuit package utilizing low temperature sealing glass and having reduced lead to lead capacitance. The inventive package includes a cap and a base. The base includes a ceramic base substrate, a first layer of conductive material adjacent the ceramic base substrate to serve as a ground plane, and a second layer of conductive material adjacent the ceramic base to serve as a power plane. A glass material is selectively deposited on the base substrate to form at least one discrete void for housing an integrated circuit chip, and a lead frame having a plurality of leads is embedded in the glass material and electrically connected to the ground and power planes but physically separated therefrom. In one embodiment, integral decoupling capacitors are further included on the base substrate. Incorporation of ground and power planes and decoupling capacitors into a ceramic-glass integrated circuit package adapts these low cost packages to high-speed applications.

29 Claims, 7 Drawing Sheets

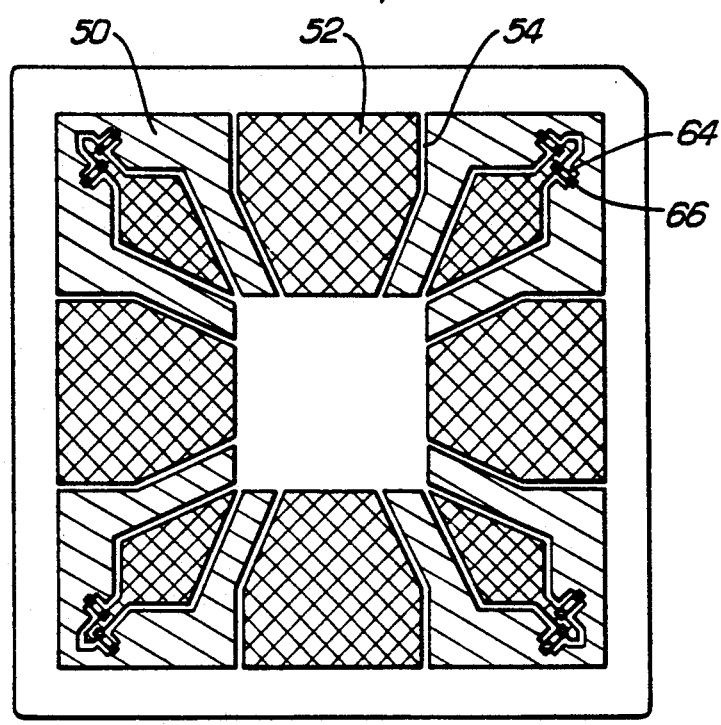
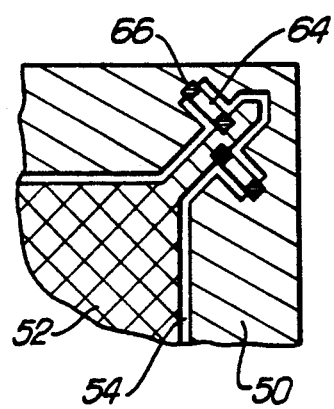
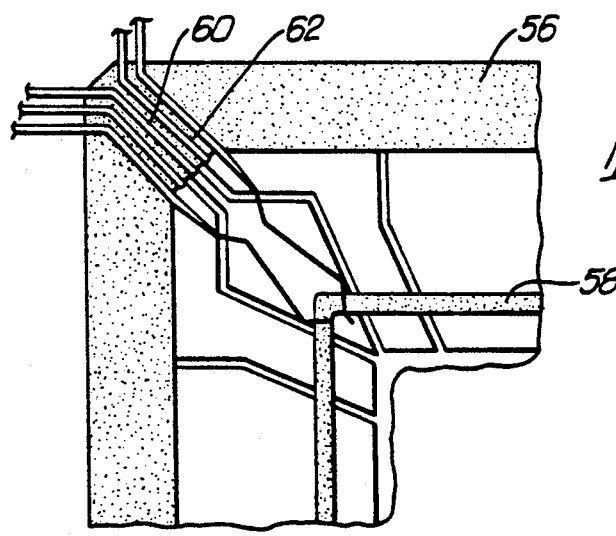
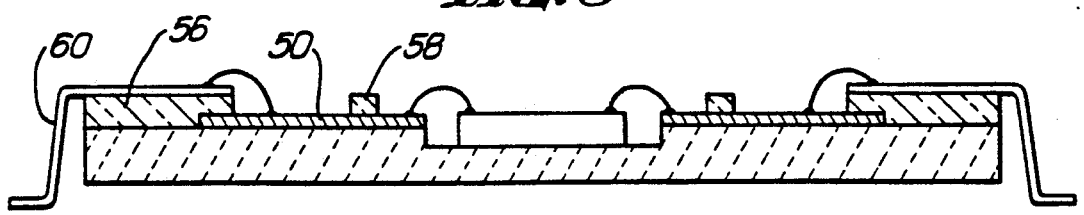

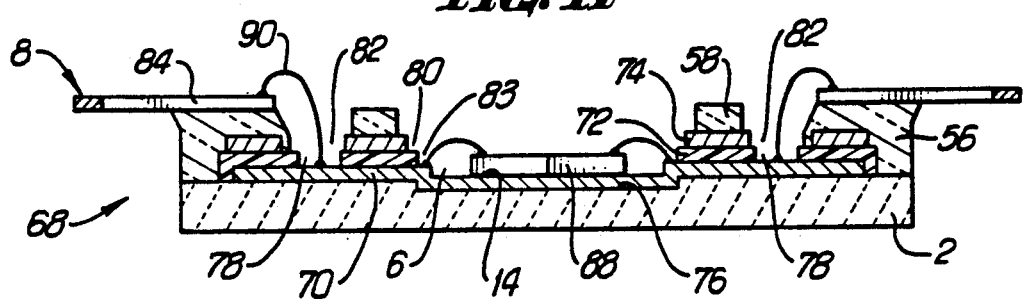
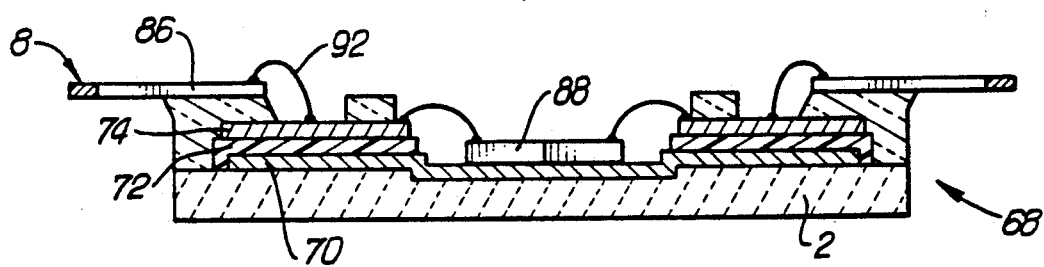
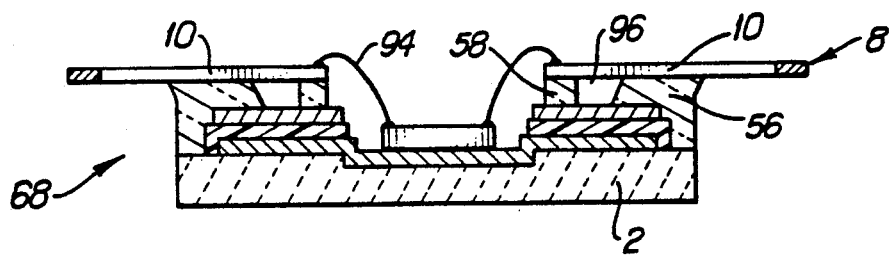

CERAMIC GLASS INTEGRATED CIRCUIT PACKAGE WITH INTEGRAL GROUND AND POWER PLANES

This is a continuation-in-part of application Ser. No. 07/641,698, filed Jan. 16, 1991, which is a continuation-in-part of application Ser. No. 07/519,796, filed May 7, 1990, now U.S. Pat. No. 4,992,628, issued Feb. 12, 1991.

BACKGROUND OF THE INVENTION

1. Field of the Invention

The present invention relates to the field of integrated circuit packaging, and more specifically to a glazed ceramic package with low lead to lead capacitance for integrated circuits usable at high frequencies.

2. Related Art

Almost all semiconductor components are enclosed in packages when they are incorporated into a working electronic system. Typically, integrated circuits are enclosed in an appropriate package prior to their sale by the integrated circuit manufacturer.

There are many reasons for providing a proper encapsulation environment around an integrated circuit chip. The order of importance of these packaging factors depends on the particular component considered, and how it is to be tested and utilized. However, there are several functions of packaging for such chips which are common to all chips and environments. For example, appropriate packaging of an integrated circuit chip generally results in a dramatic economy in assembly. Integrated circuit chips are extremely small and fragile, and therefore are difficult to handle without the aid of magnifying and manipulating equipment. Placement of a chip into an integrated circuit ("IC") package overcomes the difficulty of handling the chip by providing a relatively large and easily handled package configuration. A second important function fulfilled by IC packages is mechanical protection of the chips. Because integrated circuit chips are generally made from fragile materials, they must be protected from the possibility of scratches and chipping. A third essential function of an IC package is to shield the enclosed integrated circuit chip from the surrounding environment so as to preclude corrosion and other detrimental effects resulting from exposure to the normal environment.

A number of different IC package designs are available. Some IC packages are constructed of multilayers of high purity alumina ceramic interconnected with refractory metal pads. These IC packages, known as Flatpaks, include brazed-on lead frames for electrically connecting a chip. Unfortunately, Flatpaks are relatively expensive to manufacture. A less costly IC package design is embodied in "ceramic-glass IC packages".

Ceramic-glass IC packages generally comprise two basic components: (1) a base having an embedded lead frame, and (2) a cap. In the production of these ceramic packages, glass material is screened onto a ceramic base (or substrate) consisting typically of a single pressed and/or fired layer of ceramic. The glass material is distributed so as to cover the base, leaving uncovered at least a small chip cavity which is generally in the center of the substrate. The small chip cavity ("die attach cavity") is typically metallized to provide an attachment site ("die attach pad") for an integrated circuit chip before the glass is screened onto the base substrate. Next, the metallic lead frame is positioned in the glass material on the package base such that when the base is heated to an elevated temperature, the glass material becomes molten and flows around the lead frame. After the glass material has cooled, the lead frame is embedded in the glass material, spaced apart from the package base.

The package cap is manufactured in essentially the same way as the package base, but without the embedding of a lead frame. In other words, the ceramic material which will become the package cap is screened with a glass material so as to cover all but a central area in the cap. The cap and glass material are then fired in a furnace to allow the glass material to adhere to the package cap material.

One frequently utilized ceramic-glass IC package is the ceramic dual in-line package ("CERDIP"). In a CERDIP the body of the package is constructed of an extremely hard ceramic material, and the lead frame consists of metal leads configured in two parallel rows which extend from the body in line with one another.

A second frequently utilized ceramic-glass IC package is the "CERQUAD". As in the CERDIP, the body of the CERQUAD is constructed of a hard ceramic material. However, the lead frame consists of metal leads configured as two sets of two parallel rows perpendicular to one another, typically with the ceramic body in a square configuration.

An integrated circuit manufacturer will use a package base and package cap to form a CERDIP or a CERQUAD in the following manner: an integrated circuit chip is placed in the central chip cavity in the package base; the integrated circuit chip is affixed to this central cavity by bonding it to the metallized layer, and is electrically connected, via minute wires, to the portion of the lead frame which extends around the central cavity; once the integrated circuit chip is electrically and mechanically affixed to the package base, the cap is placed on the base and the entire unit is fired at a temperature higher than the temperature used to adhere the glass material to the package base and cap. During this last firing, the glass material may undergo a devitrifying process so as to render the glass material similar to a crystalline ceramic. This crystalline glass, having a greatly increased mechanical strength, then securely couples and seals the cap to the base, resulting in a single device. In most cases, however, a vitreous, non-devitrifying glass is used, which has mechanical strength equivalent to the devitrifying glass prior to devitrification.

A great deal of research has been performed to develop glass materials which can be accurately screened onto ceramic materials forming ceramic-glass IC packages, fired at a relatively low temperature to permit affixing of the glass material to the ceramic material, and then fired at higher temperatures to make the final seal.

The development of a relatively low firing temperature solder glass has greatly contributed to the higher reliability of certain integrated circuits. Unfortunately, this increase in reliability was accompanied by a corresponding and substantial detriment. Specifically, to alter the chemical composition of the glass material, it was necessary to introduce materials such as zirconium and titanium. The introduction of such materials into the glass, however, has significantly increased the dielectric constant in the glass, resulting in a significant increase in the parasitic capacitance between the closely aligned leads of the lead frame. This high parasitic lead capacitance has, in certain situations, precluded the utilization of low temperature ceramic-glass IC packages for certain integrated circuit chips. Also, even if some integrated circuit chips can be successfully utilized in a low temperature ceramic-glass IC package at a relatively low frequency, they cannot be used at higher frequencies because excessive parasitic capacitance results in undesirable attenuation, distortion, and cross-talk of the electrical signals transmitted by the leads of the package.

It would be very desirable to have a low temperature ceramic-glass IC package which may be used for high frequency applications and which may be produced at relatively low cost. The present invention provides such a package.

SUMMARY OF THE INVENTION

The present invention provides a package for housing an integrated circuit chip and a method for producing that package. More specifically, the present invention provides a ceramic-glass IC package which utilizes low temperature glass material and has a low lead to lead capacitance.

The package of the present invention comprises a cap and a base, the base including an embedded lead frame and an embedded layer of electrically conductive material which serves as a ground plane. The lead frame and ground plane are both embedded in glass material which is selectively deposited on a ceramic base substrate forming the base. In one embodiment of the invention, the ground plane may be formed as an extension of the metallization layer of the chip cavity/die attach pad. Alternatively, the ground plane may be a layer of conductive material separated from the die attach pad by ceramic or glass material and thus electrically isolated from the die attach pad.

The lead frame, with its plurality of electrical leads, is embedded in the glass material on the base substrate so that the lead frame is adjacent and approximately parallel to the substrate but is physically separated from both the die attach pad and the ground plane. At least one of the leads of the lead frame is connected to the ground plane. The lead may, for example, be connected by a wire which is down-bonded through the chip cavity. Alternatively, holes may be provided in the glass separating the ground plane from the lead frame and solder balls may be inserted therein to electrically connect the leads to the ground plane. In one embodiment wherein the ground plane is electrically isolated by being placed between multiple layers of ceramic, via holes are drilled or otherwise formed into the top layer of ceramic and pieces of conductive material such as solder balls are embedded in the glass material in alignment with the via holes to electrically connect the ground plane with the lead frame.

In another embodiment of the invention, the base of the package further includes a second embedded layer of electrically conductive material which serves as a power plane. This power plane is electrically insulated from both the ground plane and the chip to be mounted in the chip cavity. The power plane and the ground plane can be coplanar or on different planes. When both planes are coplanar, they may be electrically insulated each other by insulating gaps on the same plane. On the other hand, when the power plane and the ground plane are on different planes, they may be electrically insulated each other by an interposing dielectric layer. In these embodiments, at least one of the leads of the lead frame is connected to the power plane. Again, the lead may be connected by a wire which is down-bonded through the chip cavity or holes may be provided in the glass separating the power plane from the lead frame and solder balls may be inserted therein to electrically connect the leads to the ground plane.

In another embodiment of the present invention, the glass material is selectively deposited on the base and cap substrates so as to form two or more discrete, corresponding voids such that when the cap is positioned on the base, the juncture of the voids in both the cap and the base form a plurality of cavities in the glass material through which the leads of the embedded lead frame pass. In this embodiment, the power and ground leads do not extend all the way across the base to the chip cavity. Instead, these leads are downbonded to the power and ground planes, respectively, upon entering the first void, close to the periphery of the package. By reducing the length that the leads run parallel to one another, inductance is decreased.

Yet another embodiment of the present invention includes a plurality of integral chip decoupling capacitors connecting the integral power and ground planes to further improve the electrical performance of the package at high frequencies. The novel features which are believed to be characteristic of the invention, both as to its organization and its method of operation, together with further objects and advantages thereof, will be better understood from the following description in connection with accompanying drawings in which several embodiments of the invention are illustrated by way of example. It is to be expressly understood, however, that the drawings and detailed description are provided for illustration and description only and are not intended as a definition of the limits of the invention.

BRIEF DESCRIPTION OF THE DRAWINGS

FIGS. 7a and 7B is a top view of power and ground planes which are incorporated into the base substrate of another embodiment of the present invention.

FIG. 8 is a partial top view of a base substrate of an embodiment of the invention including the power and ground planes shown in FIGS. 7a and 7b embedded in glass material which is selectively deposited on the base substrate.

FIG. 9 is a cross-sectional side view of the embodiment of the invention shown in FIG. 8.

FIG. 11 is a cross-sectional side view of the embodiment of the inventive ceramic-glass IC package shown in FIG. 10, taken along line 11—11 of FIG. 10.

FIG. 12 is another cross-sectional side view of the embodiment of the inventive ceramic-glass IC package shown in FIG. 10, taken along line 12—12 of FIG. 10.

FIG. 13 is a further cross-sectional side view of the embodiment of the inventive ceramic-glass IC package shown in FIG. 10, taken along line 13—13 of FIG. 10.

Like reference characters in the various drawings refer to like elements.

DETAILED DESCRIPTION OF THE INVENTION

The present invention provides a ceramic-glass IC package which has a low lead to lead capacitance while using low temperature sealing glass. The package is generally comprised of a base substrate and a cap substrate, each coated with a vitreous or devitrifying glass frit material. The deposition of the glass frit material is controlled such that there is at least one area on the base substrate devoid of the glass material to provide a site for attachment of an integrated circuit chip. A ground plane and a lead frame are embedded in the glass material on the base substrate separated from one another by glass material but electrically connected in one or more places. The inclusion of a ground plane results in a substantially lessened parasitic capacitance between the leads of the lead frame. Further, the inclusion of a power plane lends decreased induction of power lines to the IC package.

Figure 1:
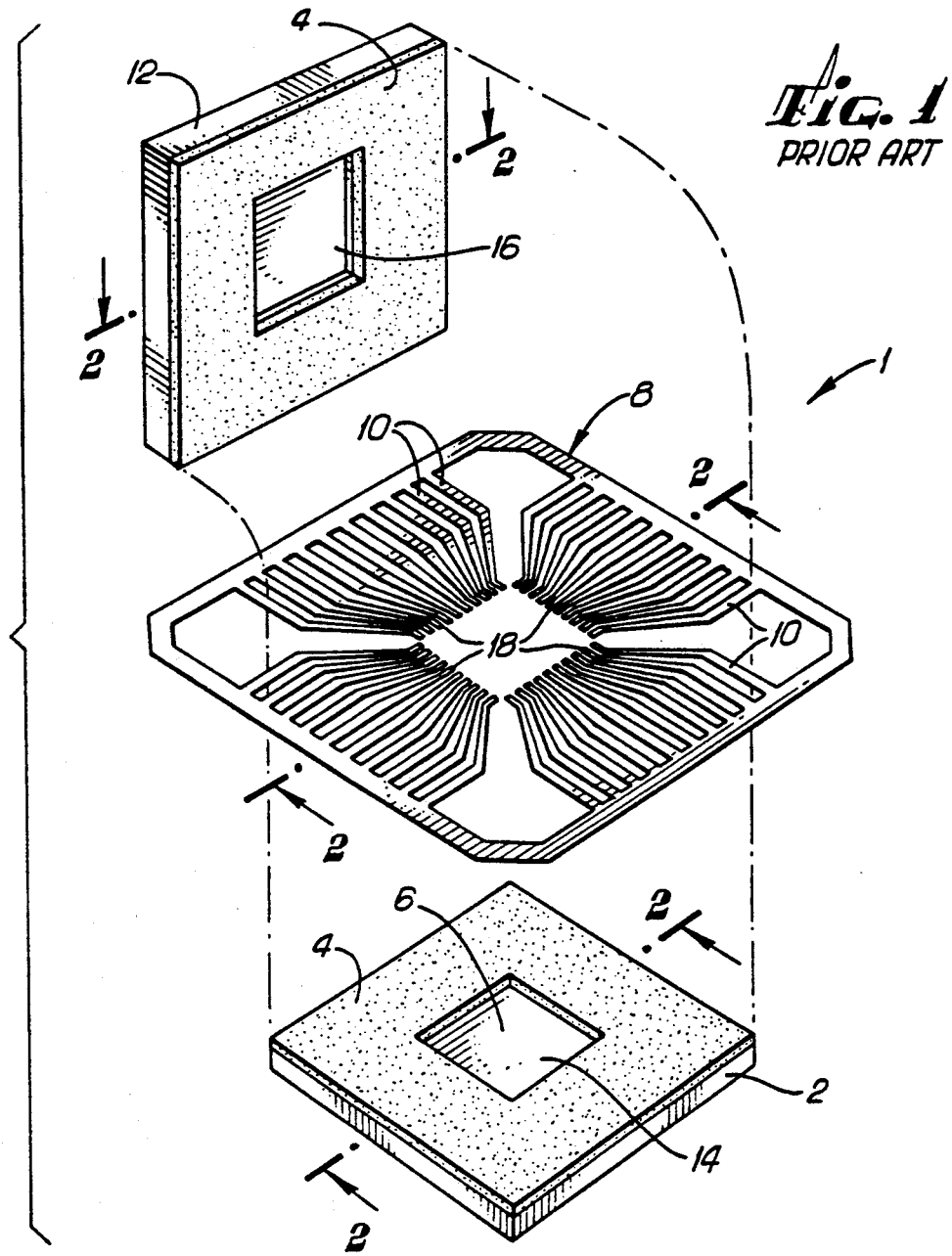
FIG. 1 is an exploded view of the construction of a prior art CERQUAD IC package.

Referring to FIG. 1, an exploded view of a prior art construction of a ceramic-glass IC package (in this case a CERQUAD package) can be seen. The major components of the prior art ceramic-glass IC package consist of a base substrate 2, a lead frame 8, and a cap substrate 12. A metal die attach pad 14 is typically printed or otherwise deposited in the center of the base substrate. The die attach pad 14 is sized to provide a site for attachment of an integrated circuit chip. Next, a vitreous or devitrifying glass frit material 4 is typically screened onto the base substrate 2 in one or more layers by well-known screening processes. As can be seen in FIG. 1, the layers of glass material 4 are screened onto the base substrate 2 in the prior art constructions to form a uniform glass layer across the base substrate 2 except for a central die attach cavity 6 which corresponds in size and location to the die attach pad 14.

In the prior art construction of ceramic-glass IC packages, the cap substrate 12 is also covered with a layer of vitreous or devitrifying glass frit material 4 by the same screening process which is used to apply the glass material 4 on the base substrate 2. Again in the prior art construction, the glass material 4 is deposited uniformly across the cap substrate 12, except for a chip cavity 16, which is devoid of glass material 4.

During the assembly of prior art ceramic packages, a lead frame 8, with its associated leads 10, is embedded in the glass frit material 4 on the base substrate 2. The lead frame 8 is positioned on the base substrate 2. The vitreous or devitrifying glass material 4 is then heated to a temperature at which the glass material 4 becomes semi-liquid and flows around the leads 10 of the lead frame 8. Once the glass material 4 cools, the glass material 4 becomes a solid and thus securely holds the lead frame 8 in its position adjacent to the base substrate 2. The cap substrate 12 and its glass material 4 are similarly heated and then cooled so that the glass material 4 adheres to the cap substrate 12.

In the utilization of a prior art ceramic package such as the CERQUAD shown in FIG. 1, an integrated circuit chip (not shown) is placed in the die attach cavity 6. The integrated circuit chip is then bonded to the die attach pad 14 in the die attach cavity 6 and electrically coupled to the lead frame 8. This electrical coupling is performed by connecting minute wires from the integrated circuit chip to the bonding wire pads 18 at the inward-most portion of the leads 10. Next, the cap substrate 12 is placed above the base substrate 2 and properly aligned with the base substrate 2 whereby the die attach cavity 6 and chip cavity 16 are aligned to form a glass-free cavity 20 shown in FIG. 2. The entire assembly is then fired in a furnace at a sealing temperature substantially above the temperature used to create an adherence between the glass material 4 and either the base substrate 2 or cap substrate 12. If a devitrifiable glass is used, this elevated temperature will result in the devitrifying of the glass material 4 and will result in the secure adherence of the cap substrate 12 to the base substrate 2.

Figure 2:
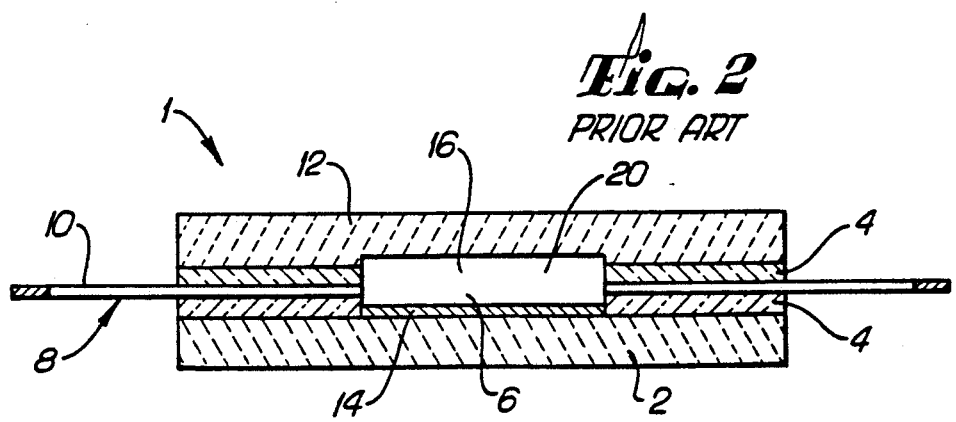
FIG. 2 is a cross-sectional view of a prior art CERQUAD IC package.

FIG. 2 is a cross-sectional view of the completed prior art CERQUAD package 1 shown in FIG. 1, taken along the lines 2—2 of FIG. 1. Located above the base substrate 2 is the cap substrate 12, each substrate being fused to the other by the glass material 4.

The prior art construction of ceramic packages, as illustrated in FIGS. 1 and 2, is generally very successful in encapsulating an integrated circuit chip in an extremely hard ceramic package. However, due to the passage of the leads 10 of the lead frame 8 through the glass material 4, the electrical parasitic capacitance between the leads 10 is high. These packages therefore cannot be used for high frequency applications since the distortion and crosstalk of the electrical signals due to the parasitic capacitance would be too great.

Figure 3:
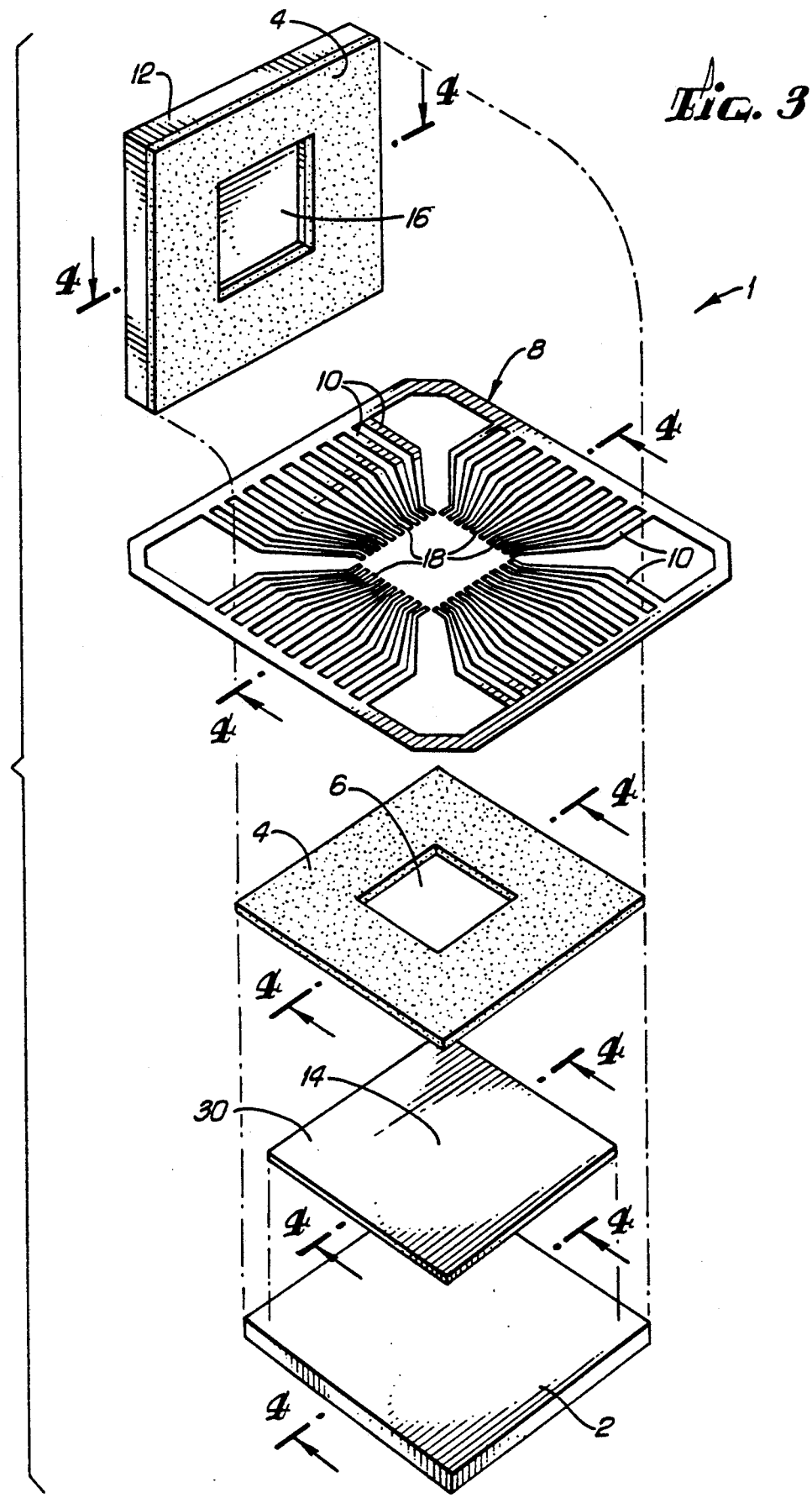
FIG. 3 is an exploded view of one embodiment of a ceramic-glass IC package in accordance with the present invention.

FIG. 3 illustrates, in an exploded view, the construction of one embodiment of a ceramic-glass IC package of the present invention (in this case a CERQUAD package). As in the prior art construction of a ceramic-glass IC package, a metal pad 30 to which an integrated circuit chip may be affixed is deposited on the base substrate 2 and a vitreous or devitrifying glass frit material 4 is selectively deposited on the base substrate 2 by a well known screening process. Also, as in the prior art construction, the glass material 4 is not deposited in the die attach cavity 6. However, in distinction to the prior art construction, the metal pad 30 covers substantially the entire surface of the base substrate 2 to form a ground plane in addition to forming a die attach pad 14. In other words, in this embodiment, the die attach pad 14 present in the prior art ceramic-glass IC package is extended to form a die attach pad/ground plane 30.

Figure 4:
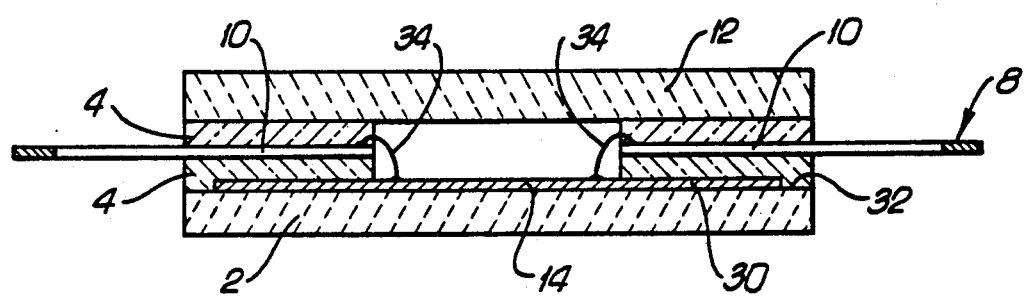
FIG. 4 is a cross-sectional side view of the embodiment of the ceramic-glass IC package shown in FIG. 3.

FIG. 4 is a cross-sectional view of the completed inventive ceramic-glass IC package shown in FIG. 3, taken along line 4—4 of FIG. 3. This illustration more clearly shows the ground plane 30 as being an extension of the die attach pad 14. The ground plane 30 preferably does not completely cover the base substrate 2, leaving instead a small margin 32 around the periphery of the base substrate 2. This margin 32 is filled in with glass material 4. While the small margin 32 is not required, filling this area with glass material 4 improves bonding between the layers of the completed ceramic-glass IC package.

A variety of metals may be utilized to form the ground plane 30. Suitable metals include, for example, a molybdenum-manganese combination, silver, gold, or (in cases where the base substrate is formed from multiple layers of green tape ceramic) tungsten.

As in the prior art assembly of a ceramic-glass IC package, the CERQUAD package embodying the present invention, as shown in FIGS. 3 and 4, embeds the lead frame 8 in the glass material 4 which has been screen-printed onto the base substrate 2 in one or more layers. When embedded, the lead frame 8 is separated from the ground plane 30 by glass material 4. One or more of the leads 10 of the lead frame 8 of the inventive ceramic-glass IC package is electrically coupled to the ground plane 30. In the embodiment illustrated in FIG. 4, the leads 10 are electrically connected to the ground plane by small wires 34 which are down-bonded to the die attach pad portion 14 of the ground plane 30 through the die attach cavity 6.

Figure 5:
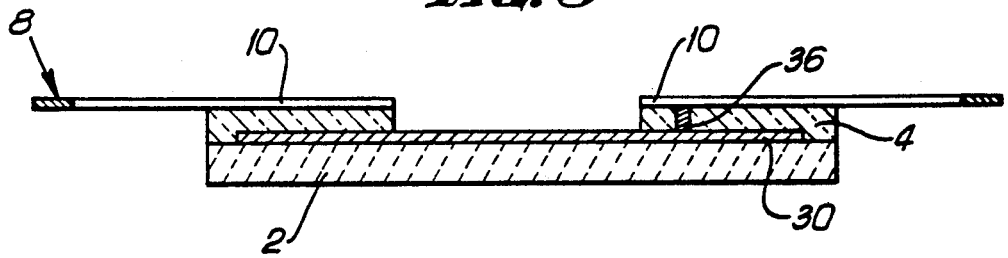
FIG. 5 is a cross-sectional side view of the base substrate of another embodiment of the inventive ceramic-glass IC package.

FIG. 5 illustrates in cross-section the base substrate 2 of an alternate embodiment of the invention wherein a lead 10 of the lead frame 8 and the ground plane 30 are electrically coupled by a solder ball 36. Specifically, in this embodiment, a small hole is drilled or otherwise placed through the glass material after it has been screened onto the base substrate 2 and conductive material such as a solder ball 36 is inserted therein to contact the ground plane 30. The lead frame 8 is then placed onto the glass material so that one of its leads 10 is aligned with the solder ball 36 and the entire base substrate is fired to embed the lead frame 8 in the glass 4 and to simultaneously permit one of the leads 10 to contact the solder ball 36, thus establishing an electrical contact between the lead 10 and the ground plane 30.

Figure 6:
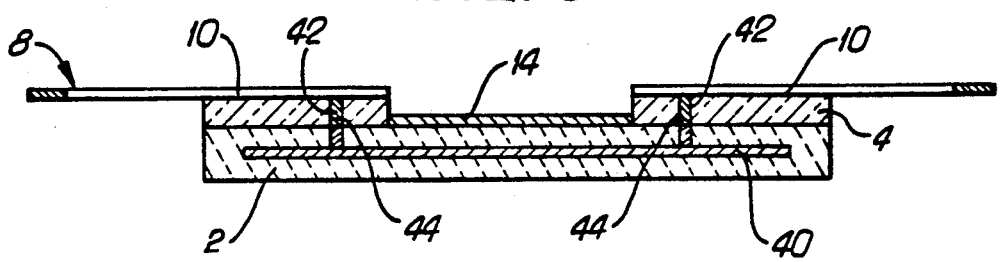
FIG. 6 is a cross-sectional side view of the base substrate of yet another of the inventive ceramic-glass IC package.

FIG. 6 illustrates in cross section the base substrate 2 of yet another embodiment of the present invention. In this embodiment, the base substrate 2 comprises multiple layers of pressed ceramic green tape. Prior to pressing the layers of the green tape, a layer 40 made of conductive material is printed between two of the green tape layers. This conductive layer 40 serves as the ground plane. The surface of the base substrate is additionally provided with a separate smaller metallized area which serves as the die attach pad 14. The die attach pad 14, in turn, is surrounded by glass material 4 as in the prior art ceramic-glass IC package illustrated in FIGS. 1 and 2. Also, as in the prior art ceramic-glass IC package, a metal lead frame 8 is embedded in the glass material, separated from the die attach pad 14 by the glass material 4.

In the embodiment illustrated in FIG. 6, the ground plane is electrically isolated from the die attach pad 14. To establish an electrical connection between the lead frame 8 and the ground plane 40, one or more of the leads 10 of the lead frame 8 are electrically connected to the ground plane by a combination of solder balls 44 and via holes 42. Specifically, before the glass is screen-printed onto the base substrate 2, a plurality of small via holes 42 are drilled or punched through the top layer of the green tape forming the base substrate 2 to provide access to the ground plane 40. The via holes 42 are filled with a suitable, electrically conductive material, e.g., tungsten. Next, glass material is screen-printed onto the base substrate. Small holes aligned with the via holes 42 are then drilled or otherwise placed into the glass material and pieces of conductive material such as solder balls 44 are placed therein. Finally, a lead frame is placed onto the glass layer so that at least one lead 10 is aligned with a solder ball 44. The entire base substrate is then fired to an elevated temperature to allow the glass material to melt and the lead frame 8 to become embedded therein. At least one lead 10 of the lead frame 8 thereby contacts a solder ball 44 and establishes electrical contact between the leads 10 and the ground plane 40.

Yet another embodiment of the present invention further includes an integral power plane in addition to the integral ground plane. FIGS. 7a and 7b illustrates a metallization pattern which serves as ground and power planes for such an embodiment. It has been determined that the "kite-shape" metalization pattern shown optimizes the current path in the ground plane 50 and the power plane 52. While the ground plane 50 is in electrical contact with the chip and thus may be an extension of a metal die attach pad, the power plane 52 is electrically insulated from the chip and thus must be insulated from the chip cavity if metal serves as the die attach pad. Insulating gaps 54 insure electrical separation between the ground and power planes. While the metallization pattern depicted results in coplanar ground and power planes, other metallization patterns, including ones wherein the ground and power planes are on different planes, may be utilized.

The ground and power planes may be created by a thick film metal paste which is printed unto the base substrate and then fired. Gold or silver are examples of metals suitable for forming such a paste. Alternatively, the substrate may be provided with a molybdenum-manganese or tungsten surface onto which nickel and-/or gold is plated.

FIGS. 8 and 9 show an embodiment of the present invention including the integral coplanar ground and power planes 50 and 52, respectively, depicted in FIGS. 7a and 7b, embedded in glass material selectively deposited on the base substrate. The glass material is preferably screened unto the base substrate to form a peripheral sealing ring 56 and an interior ring 58 as more fully described in U.S. Pat. No. 4,931,854 to Yonemasu et al., the teaching of which is incorporated herewith by reference.

In the embodiment shown in FIGS. 8 and 9, the ground lead 60 is wire bonded to the ground plane 50 in the vicinity of the peripheral sealing ring 56. Similarly, the power lead 62 is wire bonded to the power plane 52 in the vicinity of the peripheral sealing ring 56. Depending on the type of metal selected for formation of the ground and power planes, the power and ground leads may, for example, be wire bonded using gold and/or aluminum wire. The leads of the lead frame must be configured to accommodate such wire bonding. By bonding the ground and power leads to the ground and power planes, respectively, within a short distance after the leads enter the package, line resistance, as well as power and ground inductance, is generally decreased.

While the embodiment depicted in FIGS. 8 and 9 is particularly advantageous for high frequency applications, other patterns of glass deposition and other arrangements of the ground and power leads may be utilized. For example, the entire surface of the base substrate outside the chip cavity may be covered by glass and the ground and power leads may extend across the entire base substrate surface and be connected to the ground and power planes by solder balls, as described in the earlier embodiments.

FIGS. 7a and 7b additionally illustrates a plurality of integral chip decoupling capacitors 64 which may be included in the IC package to further improve the electrical performance of the devices. Any suitable decoupling capacitors known to the art and small enough to fit within the IC package may be utilized. The capacitors 64 are preferably soldered to a metallized capacitor pad (not shown) by one or more solder joints 66. The capacitor pad area may be metallized using the same method and metal as is used for the formation of the ground and power planes.

Figure 10:
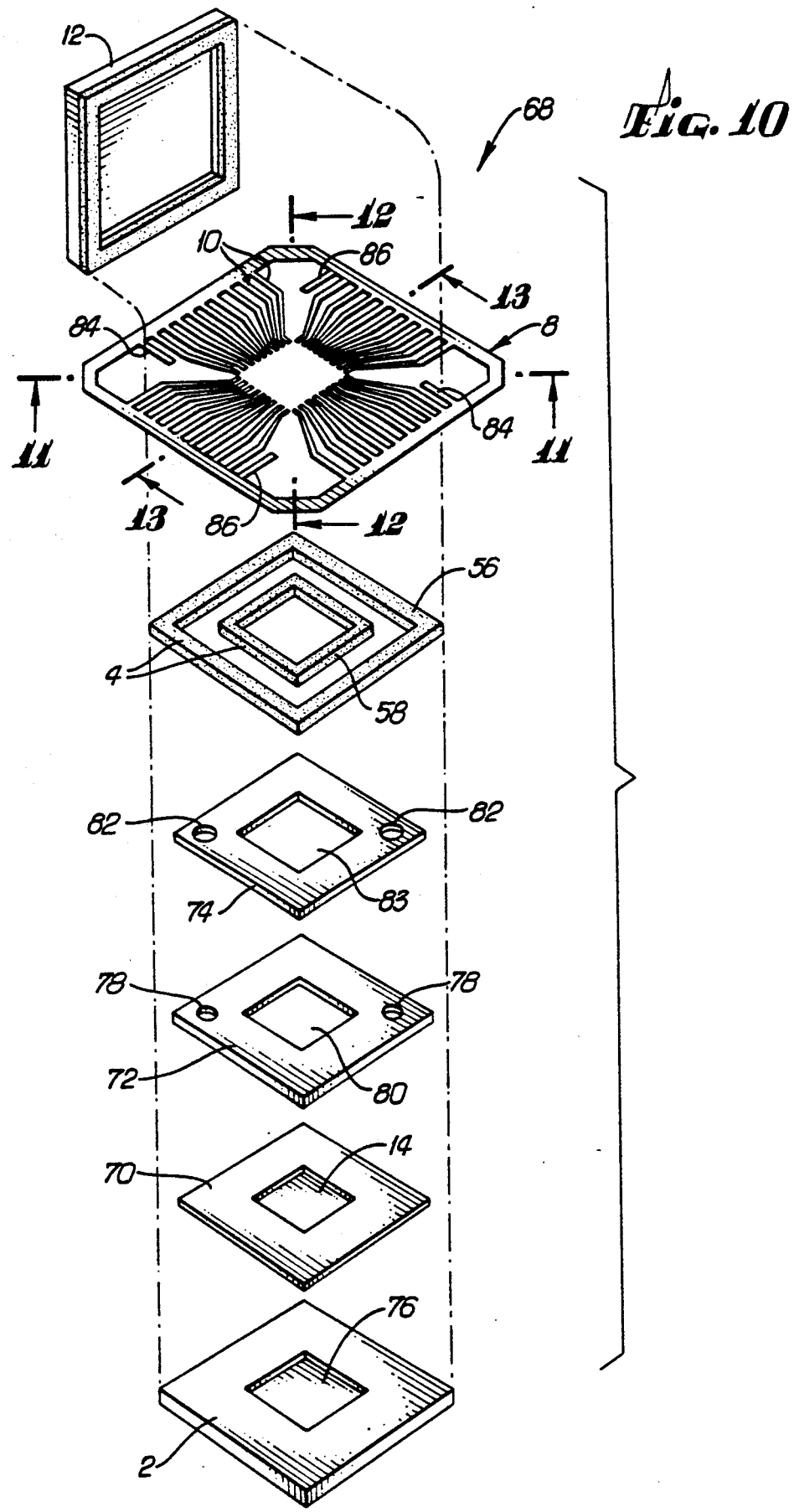
FIG. 10 is an exploded view of a further embodiment of the present invention including power and ground planes in a laminated structure.

FIG. 10 illustrates, in an exploded view, the construction of a further embodiment of an IC package 68 of the present invention. In FIG. 10, a base substrate 2, a first conductive layer 70, a dielectric layer 72, a second conductive layer 74, a glass material 4, and a lead frame 8 are stacked successively. As each component is laid on the top of the base substrate 2, heating at appropriate temperatures is required. The heating temperatures can vary at each step. If firing of the layer is necessary, the heating temperature is in a range of about 800° C. to about 900° C. If glazing of the glass material is necessary, the heating temperature is in a range of about 390° C. to about 450° C.

As described hereinbefore, the first conductive layer 70 is deposited on the base substrate 2 by applying a metal paste on the surface thereof (printing). The first conductive layer 70 covers substantially the entire surface of the base substrate 2 to form a die attach pad 14. The base substrate 2 may have a depression 76 in which the pad 14 will fit. Alternatively, the base substrate 2 can be planar, as seen in FIG. 3. Next, the dielectric layer 72 is deposited on the first conductive layer 70 by printing a dielectric material on the surface thereof. The dielectric layer 72 is made of a dielectric material (preferably aluminum oxide). The most preferred material for the layer 72 is Dupont Dielectric Composition 5704 available from Dupont and Co., Inc., Wilmington, Del.

The dielectric layer 72 has a thickness of approximately 1 to 5 mils, and is provided with a plurality of openings 78 formed through the layer 72, as well as with an opening 80. As may be seen in FIG. 10, the two openings 78 are preferably positioned diagonally across the opening 80. In a similar manner to the application of the first conductive layer 70, the second conductive layer 74 is deposited on the surface of the dielectric layer 72 when a metal paste is printed. The first conductive layer 70 and the second conductive layer 74 are each made of a metal selected from those disclosed for the ground plane 50. For both layers, silver is preferred. The second conductive layer 74 also has openings 82, 83 that match the openings 78, 80 in location and size. As in the earlier embodiment shown in FIG. 8, the glass material 4 is selectively deposited on the second conductive layer 74 to form the small interior sealing ring 58 and the large peripheral sealing ring 56.

The lead frame 8 is then placed on the assembly. In the lead frame 8, leads 84 and leads 86 are cut short such that they can be electrically connected to the first conductive layer 70 or to the second conductive layer 74, respectively. The lead frame 8 becomes partially embedded in the glass material 4 when the assembly is heated (glazed) at an elevated temperature at which the glass material 4 melts.

The cap substance 12 is not significantly different from the one disclosed in FIG. 8 of U.S. Pat. No. 4,731,854 to H. Yonemasu, et al.

FIG. 11 illustrates, in cross-section, the IC package 68 shown in FIG. 10, taken along line A—A. This illustration more clearly shows the first conductive layer 70 as being an extension of the die attach pad 14. The first conductive plane 70 is configured to form the die attach cavity 6. An integrated circuit chip 88 may be bonded to the die attach pad 14 by any conventional means. The leads 84 are electrically connected to the first conductive layer 70 by minute wires 90 which are bonded to the plane 70 through the openings 78 and 82. The first conductive layer 70 serves as a ground plane in this particular embodiment, but may serve as a power plane alternatively. Electrical coupling is completed by connecting minute wires from the edge of the first conductive plane 70 to the integrated circuit chip 88.

Referring to FIG. 12, there is shown a cross-sectional view of the IC package 68 shown in FIG. 10, taken along the B—B line wherein there are no openings through either the second conductive layer 74 or the dielectric layer 72. This illustration clearly shows the manner in which the first conductive layer 70 and the second conductive layer 74 are electrically insulated by the interposing dielectric layer 72. The leads 86 are electrically connected to the second conductive layer 74 by minute wires 92. The second conductive layer 74, in turn, is electrically connected to the integrated circuit chip 88 by minute wires, thus completing electrical coupling. The second conductive layer 74 serves as a power plane in this particular embodiment, but may serve as a ground plane, if so desired.

FIG. 13 illustrates, in cross-section, the same IC package 68, taken along line C—C of FIG. 10. The signal leads 10 are electrically coupled to the integrated circuit chip 88 by minute wires 94. The leads 10, 84, and 86 are all plated or vapor-deposited with silver or aluminum at the points to which the minute wires 90, 92, and 94 are coupled. As is illustrated in FIG. 10, after the IC package 68 has been assembled, a significant portion of the signal leads 10 pass through voids 96 partially formed between the peripheral sealing ring 56 and the interior sealing ring 58. Reduction in the electrical parasitic capacitance of the embedded leads 10 can be expected, as is disclosed in U.S. Pat. No. 4,982,494 to M. Yonemasu, et al.

Figure 14:
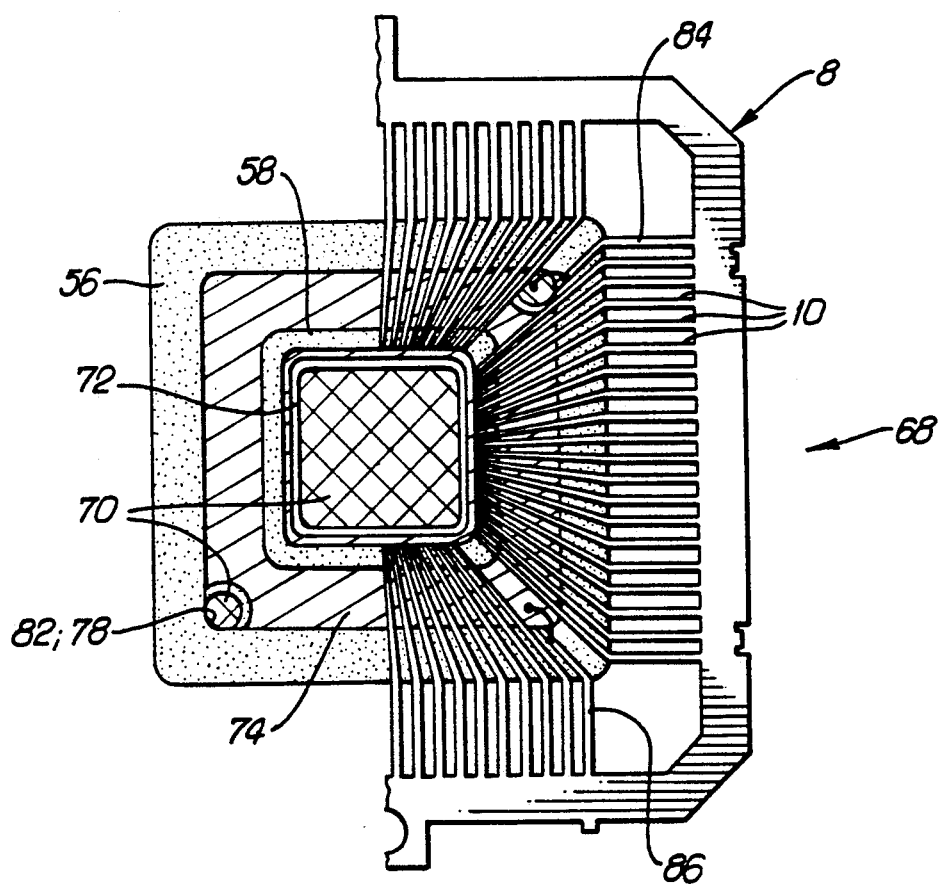
FIG. 14 is a top view of the embodiment of the inventive ceramic-glass IC package shown in FIG. 10.

FIG. 14 illustrates a manner in which the ground lead 84 and the power lead 86 are wire-bonded to the first conductive layer 70 and to the second conductive layer 74, respectively, in the vicinity of the peripheral sealing ring 56, as shown in FIG. 8.

The final assembly of the ceramic-glass IC package which embodies the present invention does not differ from the prior art assembly. That is, the user of a ceramic-glass IC package embodying the present invention places the integrated circuit chip 88 in die attach cavity 6, bonds that integrated circuit chip to the die-attach pad 14 of the base substrate 2, and electrically connects the chip to the bonding pads 18 at the extreme ends of leads 10. Once the integrated circuit chip is installed in the die attach cavity 6, a cap substrate 12 identical to the prior art cap substrate 12 is positioned over the base substrate 2, and the entire assembly is placed in a furnace where it is heated sufficiently to allow the glass material 4 to seal the assembly. This glass sealing process secures the cap substrate 12 to the base substrate 2 and completely seals the integrated circuit chip in the chip cavity 20.

The inclusion of a ground plane dramatically reduces both the parasitic capacitance between the leads and the associated signal noise. The ground plane furthermore may keep the impedance throughout the leads constant and thereby reduces signal reflections. Inclusion of a ground plane in ceramic-glass IC packages such as CERQUADS and CERDIPS thus effectively adapts such packages for high-frequency applications at very low cost.

The inclusion of an integral power plane and decoupling capacitors in addition to the ground plane further enhances the electrical performance of glass packages such as CERQUADS and CERDIPS by decreasing ground bouncing and further decreasing parasitic capacitance between the leads.

In the alternative embodiment shown in FIG. 10, the inclusion of an interposing dielectric layer between a ground plane and a power plane serves not only to reduce noise, but further lessens the need for a decoupling capacitor in multi-layer ceramic-glass IC packages by providing additional decoupling capacitance due to the inherent capacitance of the dielectrically spaced parallel planes.

In summary, a novel ceramic-glass IC package having low inter-lead capacitance and low ground/power inductance due to the presence of ground and power planes has been described herein. While specific embodiments of the present invention have been disclosed and described in detail herein, it will be understood by those skilled in the art that various changes in form and detail may be made without departing from the spirit and scope of the invention. For example, the number and location of the holes through the ceramic and/or solder balls in the glass material can be varied from the embodiments disclosed herein or alternate methods for establishing electrical contact between the lead frame and the ground and power planes may be utilized without departing from the scope of the present invention. Also, while the invention has been described with reference to the ground and power planes being embedded in glass material screen-printed onto the base substrate, the ground and power planes could, alternatively, be embedded into the glass material screened onto the cap substrate. Furthermore, the invention can easily be adapted for use with CERDIP packages or other ceramic-glass IC packages without departing from the scope of the present invention. Accordingly, it is to be understood that the invention is not to be limited by the specific illustrated embodiments, but only by the scope of the appended claims.

We claim:

1. A package for housing an integrated circuit chip comprising:
   (a) a base substrate having a glass material selectively deposited thereon so as to form at least one discrete void;
   (b) a lead frame, having a plurality of leads including at least one ground lead and at least one power lead, adjacent to the base substrate and partially embedded in the glass material;
   (c) a ground plane electrically connected to at least one of the ground leads, but physically separated therefrom;
   (d) a power plane electrically connected to at least one of the power leads, but physically separated therefrom, the power plane being electrically insulated from the ground plane; and
   (e) a cap substrate having a glass material selectively deposited thereon so as to form at least one discrete void, whereby when the cap substrate is placed on the base substrate, the voids on the cap substrate and the voids on the base substrate form at least one glass-free cavity.

2. The package of claim 1 wherein the ground plane and the power plane are coplanar.

3. The package of claim 2 wherein the ground plane and the power plane are electrically insulated from one another by insulating gaps.

4. The package of claim 1 wherein the ground plane and the power plane are on different planes.

5. The package of claim 4 wherein the ground plane and the power plane are electrically insulated from one another by an interposing dielectric layer.

6. The package of claim 5 wherein both the ground plane and the power plane comprise a layer of electrically conductive material.

7. The package of claim 6 wherein the electrically conductive material comprises a metal selected from the group principally consisting of silver, gold, molybdenum-manganese, and tungsten.

8. The package of claim 5 wherein the dielectric layer is made of a dielectric material.

9. The package of claim 8 wherein the dielectric material comprises principally aluminum oxide.

10. The package of claim 5 wherein the ground plane is electrically connected to the ground lead by at least one bonding wire directed through an opening penetrating the power plane and the interposing dielectric layer, and the power plane is electrically connected to the power lead by at least one bonding wire directed through the discrete void.

11. The package of claim 5 wherein the power plane is electrically connected to the power lead by at least one bonding wire directed through an opening penetrating the ground plane and the interposing dielectric layer, and the ground plane is electrically connected to the ground lead by at least one bonding wire directed through the discrete void.

12. The package of claim 1 wherein a first void in the glass material on the base substrate is adapted to allow an integrated circuit chip to be disposed therein and adjacent to the base substrate.

13. The package of claim 12 wherein the number of voids is two and the voids are disposed so that the glass material forms a peripheral sealing ring and an internal ring, the internal ring defining the periphery of the first void.

14. The package of claim 13 wherein the ground and power leads are electrically connected to the ground and power planes, respectively, in the vicinity of the peripheral sealing ring.

15. The package of claim 1 further comprising means for attaching an integrated circuit chip on the base substrate.

16. The package of claim 15 wherein the means for attaching an integrated circuit chip comprises a metal pad affixed in the first void of the base substrate.

17. The package of claim 16 wherein the ground plane is an extension of the metal pad.

18. The package of claim 1 further including at least one integral decoupling capacitor coupled between one of the ground planes and one of the power planes.

19. The package of claim 18 wherein each decoupling capacitor is attached to a metallized pad located on the base substrate.

20. A package for housing an integrated circuit chip comprising:
   (a) a base substrate having a glass material selectively deposited thereon so as to form at least one discrete void;
   (b) a lead frame, having a plurality of leads including at least one ground lead and at least one power lead, adjacent to the base substrate and partially embedded in the glass material;

(c) a ground plane electrically connected to at least one of the ground leads, but physically separated therefrom;

(d) a power plane electrically connected to at least one of the power leads, but physically separated therefrom;

(e) an interposing layer between the ground plane and the power plane, the layer electrically insulating the power plane from the ground plane; and (f) a cap substrate having a glass material selectively deposited thereon so as to form at least one discrete void, whereby when the cap substrate is placed on the base substrate, the voids on the cap substrate and the voids on the base substrate form at least one glass-free cavity.

21. The package of claim 20 wherein either the ground plane or the power plane is provided with at least one opening, the opening penetrating the interposing layer.

22. The package of claim 21 wherein the electrical connection has been made by a bonding wire through the opening.

23. A multi-layered base for use with an associated cap to house an integrated circuit chip, the cap comprising a substrate with a glass material selectively deposited thereon so as to form at least one discrete void, the base comprising:

(a) a base substrate having a glass material selectively deposited thereon so as to form at least one discrete void, whereby when the cap is placed on the base, the voids on the cap are adjacent to the voids on the base, thereby forming at least one glass-free cavity, the glass-free cavity being dimensioned to house an integrated circuit chip, (b) a lead frame, having a plurality of leads, partially embedded in the glass material of the base substrate;

(c) a first conductive layer mounted on the base substrate, the first layer substantially covering the surface of the base substrate;

(d) a dielectric layer positioned on the first conductive plane, the dielectric layer having at least one opening formed therethrough;

(e) a second conductive layer positioned on the dielectric layer, the second plane having at least one opening formed therethrough in alignment with the opening of the dielectric layer, and being electrically insulated from the first conductive layer by the dielectric layer.

24. The base of claim 23 wherein one of the first conductive layers and the second conductive layer is a ground plane and the other is a power plane.

25. The base of claim 23 wherein the first conductive layer is electrically connected to at least one of the leads by a bonding wire through the opening of the dielectric layer and the opening of the second conductive layer.

26. The base of claim 23 wherein the second conductive layer is electrically connected to at least one of the leads by a bonding wire through one of the voids.

27. A method of manufacturing low-lead capacitance multi-layered ceramic-glass integrated circuit packages, the method comprising the steps of:

(a) providing a cap substrate;

(b) selectively depositing a glass material on the cap substrate so as to form at least one discrete void in the glass material;

(c) providing a base substance;

(d) printing a first conductive layer across substantially all of a surface of the base substrate;

(e) firing the base substrate provided with the first conductive layer;

(f) printing a dielectric layer on the fired first conductive layer of the product obtained from step (e);

(g) firing the base substrate provided with the first conductive layer and the dielectric layer;

(h) printing a second conductive layer on the fired dielectric layer of the product obtained from step (g);

(i) firing the base substrate provided with the first conductive layer, the dielectric layer, and the second conductive layer;

(j) selectively depositing a glass material on the surfaces of the first conductive layer, the dielectric layer, and the second conductive layer so as to form at least one discrete void in the glass material, the void being positioned such that when the cap substrate is placed on the base substrate, the voids in the glass material on the cap substrate and the voids in the glass material on the base substrate form at least one glass-free cavity;

(k) providing a lead frame having a plurality of leads; and (l) glazing the glass material and partially embedding the lead frame in the glazed glass material such that the lead frame is physically separated from the second conductive layer.

28. The method of claim 27 further comprising the step of electrically connecting at least one of the leads to the first conductive layer.

29. The method of claim 27 further comprising the step of electrically connecting at least one of the leads to the second conductive layer.

* * * * *